United States Patent
Hertel

(10) Patent No.: US 12,422,468 B2
(45) Date of Patent: Sep. 23, 2025

(54) METHOD OF TESTING MULTI-PANEL USER EQUIPMENT WITH SPHERICAL COVERAGE

(71) Applicant: Keysight Technologies, Inc., Santa Rosa, CA (US)

(72) Inventor: Thorsten Hertel, Santa Clara, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 264 days.

(21) Appl. No.: 18/220,318

(22) Filed: Jul. 11, 2023

(65) Prior Publication Data

US 2024/0110971 A1     Apr. 4, 2024

Related U.S. Application Data

(60) Provisional application No. 63/411,387, filed on Sep. 29, 2022.

(51) Int. Cl.
    *G01R 31/28*        (2006.01)
    *H04W 24/10*      (2009.01)

(52) U.S. Cl.
    CPC ........ *G01R 31/2822* (2013.01); *H04W 24/10* (2013.01)

(58) Field of Classification Search
None
See application file for complete search history.

(56) References Cited

U.S. PATENT DOCUMENTS

| | | | |
|---|---|---|---|
| 8,760,184 B2 * | 6/2014 | Zelder | G01R 29/0878 324/754.21 |
| 10,122,085 B2 | 11/2018 | Goyette et al. | |
| 10,914,774 B2 | 2/2021 | Rowell et al. | |
| 11,381,325 B1 | 7/2022 | Gruber | |
| 11,754,609 B2 * | 9/2023 | Kobayashi | G01R 29/0878 343/703 |
| 2015/0138026 A1 * | 5/2015 | Shay | H04B 17/12 343/703 |
| 2023/0160936 A1 * | 5/2023 | Obermaier | G01R 29/0892 343/702 |

FOREIGN PATENT DOCUMENTS

CN           112834833 A     5/2021

OTHER PUBLICATIONS

Joseph Timothy Foley et al., "Low-cost Antenna Positioning System Designed with Axiomatic Design", MATEC Web of Conferences 127, 01015 (2017), pp. 1-7.
"Tailor-Made Antenna Measurement Systems" Smitek, 2019, pp. 1-30.
Gregory F. Masters et al., "Coordinate System Plotting for Antenna Measurements", Computer Science, 2007, 1-10 pgs.
(Continued)

*Primary Examiner* — Wilson Lee

(57) ABSTRACT

Methods, and systems of testing mobile devices in a four downlink (DL) manner are described. Among other improvements, the methods and systems of the present teaching provide a practical way to provide testing of DUTs that reduces not only the complexity of a test of the DUT, but also the time, required floor space/chamber height of the test system, and equipment that are needed to complete the testing to certain requirements, such as set by a standard.

18 Claims, 4 Drawing Sheets

(56) References Cited

OTHER PUBLICATIONS

"3rd Generation Partnership Project; Technical Specification Group Radio Access Network; NR; User Equipment (UE) conformance specification; Radio transmission and reception; Part 2: Range 2 Standalone (Release 16)," 3GPP TS 38.521-2 V16.12.0 (Jun. 2022), pp. 1-696.
"3rd Generation Partnership Project; Technical Specification Group Radio Access Network; NR; Study on test methods (Release 16)", 3GPP TR 38.810 V16.6.1 (Sep. 2020), pp. 1-171.
"WF on NR FR2 OTA testing enhancements," 3GPP TSG-RAN WG4 Meeting # 104-e, R4-2214357 Electronic Meeting, Aug. 15-26, 2022, pp. 1-9.
"New SI: Study on NR frequency range 2 (FR2) Over-the-Air (OTA) testing enhancements," 3GPP TSG RAN Meeting #95e, RP-220988, Electronic Meeting, Mar. 17-23, 2022, pp. 1-4.
"Revised WID: Requirement for NR frequency range 2 (FR2) multi-Rx chain DL reception," 3GPP TSG RAN Meeting #96, RP-221753, Budapest, HU, Jun. 6-9, 2022, pp. 1-5.
Minu Jacob et al., "System for Positioning Antenna Elements of a Dut Within a Quiet Zone of an Antenna Test Chamber," U.S. Appl. No. 17/896,569, filed Aug. 26, 2022, pp. 1-50.

\* cited by examiner

METHOD OF TESTING MULTI-PANEL USER EQUIPMENT WITH SPHERICAL COVERAGE

CROSS-REFERENCE TO RELATED APPLICATIONS

The present application claims priority under 35 U.S.C. § 119(e) to U.S. Provisional Application No. 63/411,387 filed on Sep. 29, 2022. The entire disclosure of U.S. Provisional Application No. 63/411,387 is specifically incorporated herein by reference in its entirety.

BACKGROUND

Testing of mobile communications devices ('devices') such as phones, laptop computers, tablets, fixed wireless access devices is needed to measure the performance of the mobile communications equipment.

Current downlink testing of devices essentially uses one angle of arrival (AOA) with testing of the downlink with a single AOA as single-downlink or two-downlink operations is supported by devices under test (DUTs) with at least a single panel in two different polarizations.

Devices supporting four-downlink multiple input multiple output (MIMO) include at least two panels per device commonly radiating in different directions. As such, testing of these devices requires the testing of the downlink signals from at least two different distinct directions and two different angles of arrival (AOA's).

Testing of such four downlink devices with full range of orientation of the DUT with one probe with any AOA in one direction and another probe at any other AOA from the first is too complex for practical use. Specifically, current testing methods applied to four downlink devices would require an unacceptable amount of time.

What is needed, therefore, is a method and system for testing devices that overcomes at least the drawbacks described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
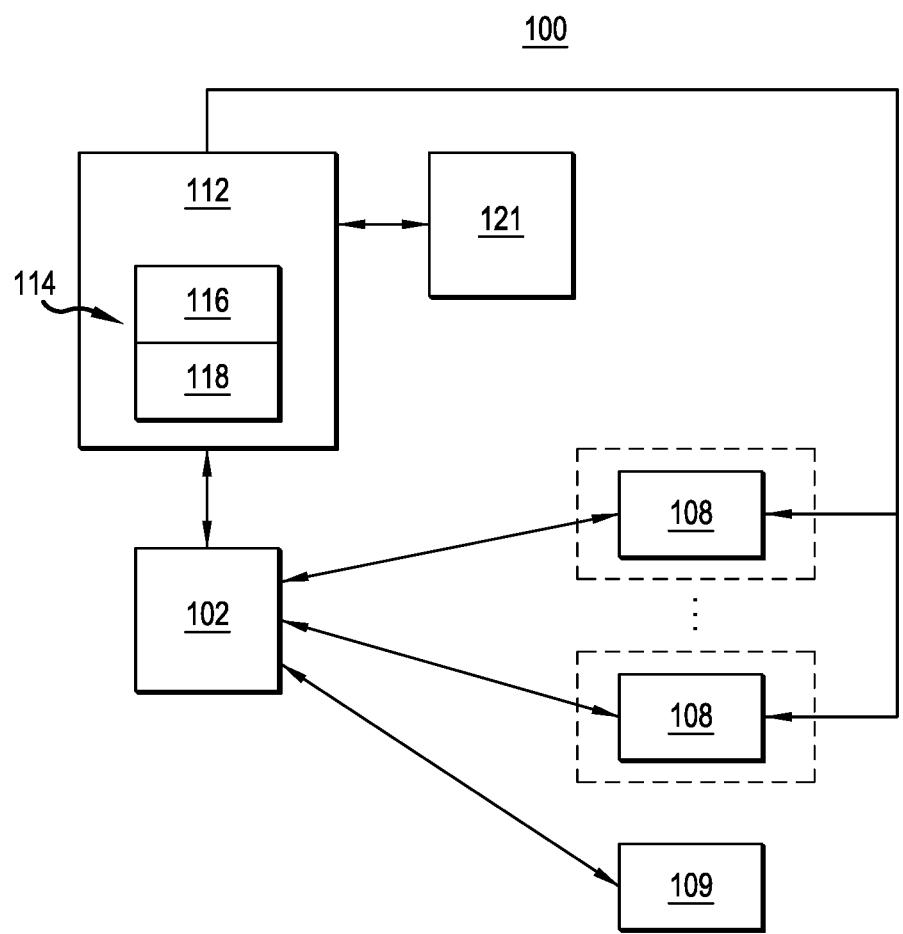
FIG. 1 is a simplified block diagram showing system for testing devices in accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

According to various embodiments, methods, and systems of testing mobile devices in a four downlink (DL) manner are described. Among other improvements, the methods and systems of the present teaching provide a practical way to provide testing of DUTs that reduces not only the complexity of a test of the DUT, but also the time, required floor space/chamber height of the test system, and equipment that are needed to complete the testing to certain requirements, such as set by a standard.

In accordance with a representative embodiment, a method for testing a communications device is disclosed. The method comprises: locating at least two first test probes adjacent to a device under test (DUT), the first test probe adapted to communicate and operate with the DUT with two signals having orthogonal polarization states; locating a second test probe adjacent to the DUT, the two or more first test probes can adjust the relative position to the second test probe and can be adapted to communicate and operate with the DUT with two signals having orthogonal polarization states; measuring a first communications value of each of discrete relative positions with first test probe; selecting a best first communications value from the discrete relative positions with at least two first test probes; selecting the relative position of the at least two first test probes that provides the best first communication value to operate during the test; and measuring a second communications value with the second test probe and the selected relative position of the at least two first test probes.

According to another representative embodiment, a system for testing a communications device is described. The system comprises at least two first test probes disposed adjacent to a device under test (DUT), the at least two first test probe adapted to communicate with the DUT with two signals having orthogonal polarization states; a second test probe disposed adjacent to the DUT, the second test probe being adapted to communicate and operate with the DUT with two signals having orthogonal polarization states; a processor; a memory that stores instructions, which when executed by the processor, cause the processor to: measure a first communications value of each of the at least two first test probes; select a best first communications value from the first communications values the at least two first test probes; select the one of the at least two first test probes that provides the best first communication value to operate during the test; and measure a second communications value with the second test probe and the selected one of the at least two second test probes.

According to yet another representative embodiment, a tangible, non-transitory computer readable medium that stores instructions is disclosed. When executed by a processor, the instructions cause the processor to: measure a first communications value of each of at least two first test probes; select a best first communications value from the first communications values of at least two first test probes; select the one of the at least two first test probes that provides the best first communication value to operate during the test; and measure a second communications value with a second test probe and the selected one of the at least two second test probes.

FIG. 1 is a simplified block diagram showing system 100 for testing a mobile device in accordance with a representative embodiment. Referring to FIG. 1, the system 100 is arranged to test a device under test (DUT) 102, which as noted above is generally a so-called multi-chain communications device.

The system comprises at least two first test probes 108 and a second test probe 109. The at least two first test probes 108 and the second test probe 109 are known test probes configured for transmitting and receiving data from the particular DUT 102. Just by way of illustration, the DUT 102, is a four downlink device, with at least two panels.

As described more fully below, the at least two first test probes 108 are disposed at a first angle of arrival (AOA) and the second test probe 109 is disposed at a second AOA that is different from the first AOA. Notably, and as will become clearer as the present description continues, the at least two first test probes 108 are disposed at different locations and AOAs from not only the AOA of the second test probe 109, but also from one another. Moreover, and as will be described more fully below, in an illustrative embodiment, the DUT 102 is adapted to move around all coordinates of a coordinate system, either a Cartesian coordinate system or a spherical coordinate system. By contrast, the at least two first test probe 108 and the second test probe 109 are fixed in location and orientation. Furthermore, the at least two first test probes 108 and the second test probe 109 are disposed at fixed distances from one another.

The system 100 also comprises a device 112 adapted to properly position the DUT 102 as needed during the testing. As described more fully below, the device 112 is adapted to rotate the DUT 102 around coordinate axes so that testing of the DUT 102 can be carried out at a number of points (sometimes referred to as grid points) on a sphere, according to various representative embodiments. The device 112 may be a system such as described in commonly owned U.S. patent application Ser. No. 17/896,569 entitled "SYSTEM FOR POSITIONING ANTENNA ELEMENTS OF A DUT WITHIN A QUIET ZONE OF AN ANTENNA TEST CHAMBER" to Jacob, et al. (a copy of which is attached to the present application). The entire disclosure U.S. patent application Ser. No. 17/896,569 is specifically incorporated herein by reference.

The device 112 comprises a controller 114. The controller 114 described herein may include a combination of a memory 116 that stores instructions and an illustrative processor 118 that executes the instructions in order to implement processes described herein. A database 121 may store information to be used for testing of the DUT 102, including identifying indicia of a particular DUT 102. The controller 114 may be housed within or linked to a workstation such as the device 112 or another assembly of one or more computing devices, a display/monitor, and one or more input devices (e.g., a keyboard, joysticks and mouse) in the form of a standalone computing system, a client computer of a server system, a desktop or a tablet. The term "controller" broadly encompasses all structural configurations, as understood in the art of the present disclosure and as exemplarily described in the present disclosure, of an application specific main board or an application specific integrated circuit for controlling an application of various principles as described in the present disclosure. The structural configuration of the controller may include, but is not limited to, processor(s), computer-usable/computer readable storage medium(s), an operating system, application module(s), peripheral device controller(s), slot(s) and port(s).

Additionally, although the device 112 and/or the controller 114 shows components networked together, two such components may be integrated into a single system. For example, the device 112 and/or the controller 114 may be integrated with a display (not shown) and/or with the system 100. On the other hand, the networked components of the device 112 (e.g., the controller 114) may also be spatially distributed such as by being distributed in different rooms or different buildings from the device 112, in which case the networked components may be connected via data connections. In still another embodiment, one or more of the components of the device 112 and/or the controller 114 is/are not connected to the other components via a data connection, and instead is provided with input or output manually such as by a memory stick or other form of memory. In yet another embodiment, functionality described herein may be performed based on functionality of the elements of the device 112 and/or the controller 114 but outside the system 100.

The controller 114 may be implemented as a processing unit. In various embodiments, the processing unit may include one or more computer processors (e.g., a processor 118), digital signal processors (DSP), field-programmable gate arrays (FPGAs), application specific integrated circuits (ASICs), or combinations thereof, using any combination of hardware, software, firmware, hard-wired logic circuits, or combinations thereof. The device 112 and/or the controller 114 may include its own processing memory for storing computer readable code (e.g., software, software modules) that enables performance of the various functions described herein. For example, the processing memory may store software instructions/computer readable code executable by the processing unit (e.g., computer processor) for performing some or all aspects of methods described herein, including various steps of the method described below with reference to FIG. 4. That is, execution of the instructions/computer readable code generally causes the processing unit of the device 112 and/or the controller 114 to test the DUT 102 as set forth below.

The system 100 also comprises a memory 116. Memories (and databases) as described herein may be RAM, ROM, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), registers, a hard disk, a removable disk, tape, floppy disk, blu-ray disk, or universal serial bus (USB) driver, or any other form of storage medium known in the art, which are tangible and non-transitory computer readable storage media (e.g., as compared to transitory propagating signals). Memories may be volatile or non-volatile, secure and/or encrypted, unsecure and/or unencrypted, without departing from the scope of the present teachings. A tangible, non-transitory computer readable medium is defined to be any medium that constitutes patentable subject matter under 35 U.S.C. § 101 and excludes any medium that does not constitute patentable subject matter under 35 U.S.C. § 101. Examples of such media include non-transitory media such as computer memory noted above devices that store information in a format that is readable by a computer or processor.

Figure 2:
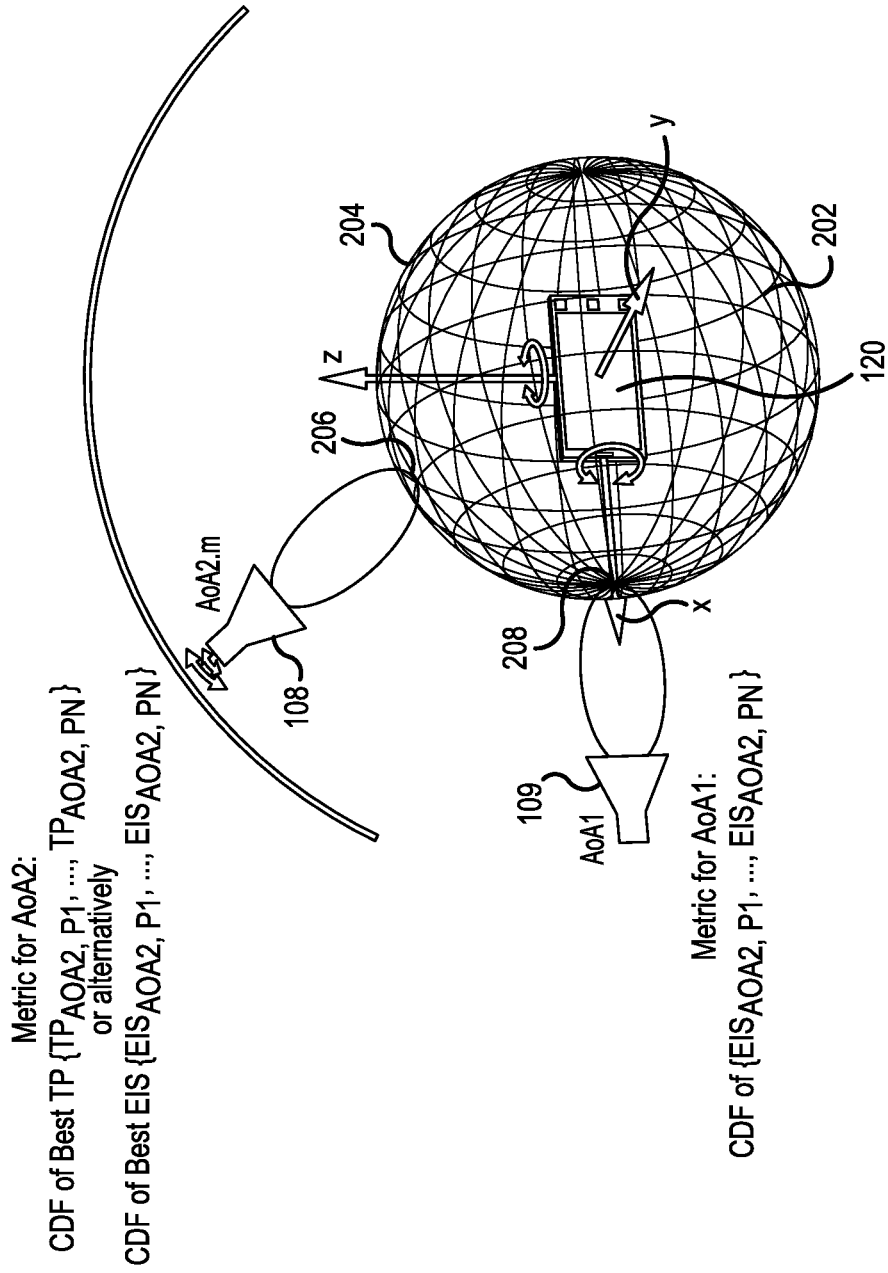
FIG. 2 is perspective view of a DUT and two probes disposed at respective grid points in accordance with a representative embodiment.

FIG. 2 is perspective view of DUT 120 with a first test probe 108 and a second test probe 109 disposed at respective grid points 202 on a sphere 204 in accordance with a representative embodiment. Notably, a grid point 202 on a sphere 204 is a point at the intersection of any two lines on the sphere 204 as shown. Notably, the sphere 204 is a mathematical construct that "moves" with movement of the DUT 120. In this way the first and second test probes 108, 109 remain stationary at the selected AoAs for each test, and the grid points on the sphere 204 move with the movement of the DUT 120. While maintaining the position of the first and second test probes 108, 109 for each measurement is merely illustrative, Applicants have discovered that moving the first and second test probes 108, 109 for each measurement and maintaining the location (and orientation) of the DUT 120 is overly complicated and not preferred.

As will become clearer as the present description continues, testing of the DUT 120 according to the present teachings can be carried out using only one first test probe 108, but requires movement of the first test probe 108 to different locations relative to the second test probe 109 for each position/orientation of the DUT 120.

In accordance with a representative embodiment, the first test probe 108 is located adjacent to the DUT 120. The first test probe 108 is adapted to transmit to and receive data from the DUT 120 with two electromagnetic signals having orthogonal polarization states, Thereby, the first test probe 108 provides a two down link connection to the DUT 120. Similarly, the second test probe 109 is adapted to transmit to and receive data from the DUT 120 with two electromagnetic signals having orthogonal polarization states, Thereby, the second test probe 109 provides a two down link connection to the DUT 120. Accordingly, the communication of data using the first test probe 108 and the second test probe 109 is a so-called four down link connection.

In accordance with a representative embodiment, the first test probe 108 is disposed at an angle of arrival (AoA2) and the second test probe 109 is disposed at another angle of arrival (AoA1) that differs from AoA2. Moreover, with the current orientation of the DUT, the first test probe 108 is disposed at location 206 on the sphere 204 and the second test probes 109 is disposed at respective grid point 208 on the sphere 204.

Testing of the DUT 120 comprises measuring a first communications value of the first test probe 108 at the particular grid point. The first communications value is illustratively a throughput (TP) of the first test probe 108 to the DUT 120, although other measurements related to the performance of the DUT 120 within the purview of one of ordinary skill in the art are contemplated. For example, the first communications value may be an effective isotropic sensitivity (EIS). As is known, the EIS is a measure of the sensitivity for an isotropic directivity device equivalent to the sensitivity of the discussed device exposed to an incoming wave from a defined AoA. The sensitivity is the minimum received power level at which specific requirement is met. And the isotropic directivity is substantially equal in all directions (i.e. 0 dBi).

After testing the TP of the first test probe 108, the first test probe 108 is moved to another relative position from the second test probe, and a second measurement of the first communications value is carried out. This movement of the first test probe 108 and testing of the first communications value at different relative positions from the second probe continues until sufficient data are gathered to complete the testing of the DUT 120. In accordance with a representative embodiment, the first test probe 108 is illustratively moved at least two times so at least two measures of the first communications value are made. Of course, movement of the first test probe 108 to more than two locations provides more data and thereby more reliable testing of the DUT 120. However, the greater the number of measurements made with the first test probe, the more complicated and time consuming the testing of the DUT will be. Accordingly, the first test probe 108 is moved illustratively between four and six times, thereby gathering four to six measurements of the first communications value at different locations and different angles of arrival (AoA2s).

After the desired number of measurements of the first communications test value are made, a best first communications value from the first communications values is selected, and the first test probe 108 is moved to the location where this first communication value was gathered.

With the first test probe 108 disposed at the grid point where the greatest first communications value occurred, a second communications value is measured with the second test probe 109, which is not moved from its original location, grid point 208. Measurement of the second communications value is then carried out with the first test probe 108 and the second test probe 109. By way of illustration, the second communications measurement value is illustratively the EIS, although the TP of the second test probe is contemplated as well.

After the testing of the DUT 120 is completed at the grid point 208, the DUT 120 is moved to a new orientation and the above-described measurements are carried out again. Just by way of example, movement of the DUT 120 may be a rotation around the x-axis and around the z-axis of the coordinate system shown. As such, by rotating the DUT 120 around each axis, measurements can be made at each grid point on the sphere 204. Notably, the sphere 204 is adapted to move with the movement of the DUT 120, so while the first test probe 108 and the second test probe 109 are stationary for each test, the respective grid point of the sphere where first test probe 108 and the second test probe 109 are located for the selected AoA changes. Again, and as will be appreciated, rotating the DUT 120 in three dimensions each of the x and z axes enables testing of at each grid point on the sphere 204. That is, for 3D testing of the DUT 120, the orientation of the DUT is moved 360 degrees around one axis, and 180 degrees around the other axis.

Upon completion of the testing, the distribution function (CDF) for the DUT 120 is determined for the second communications measurement and the best first communications measurement is determined. Again, it is emphasized that the measurement of the CDF is merely illustrative, and other indicia of performance of the DUT 120 are contemplated.

Figure 3:
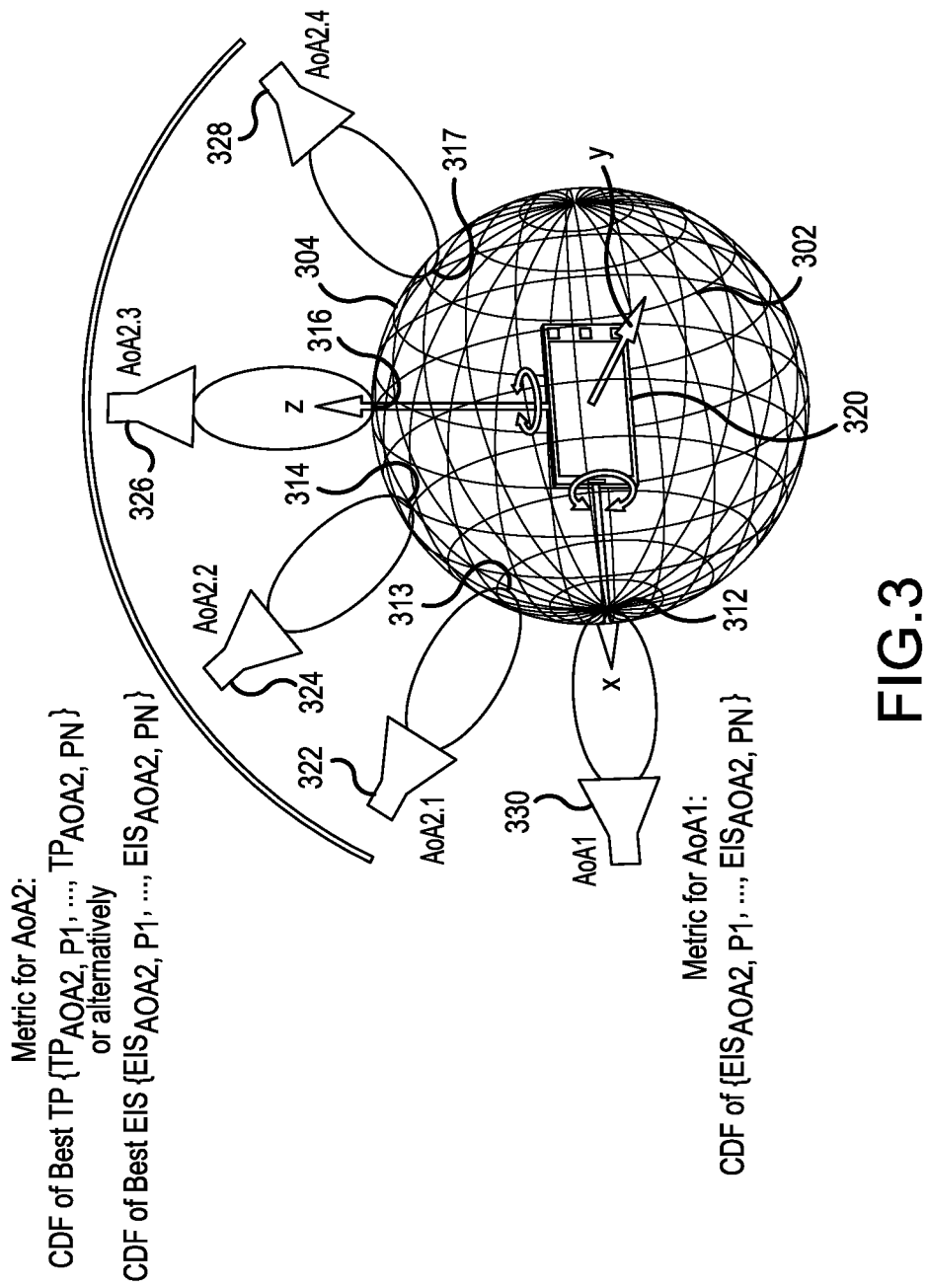
FIG. 3 is a perspective view of a device under test with a first probe and at least two additional probes in accordance with a representative embodiment.

FIG. 3 is perspective view of DUT 320 under test in accordance with a representative embodiment. Various aspects and details of the representative embodiments described in connection with FIG. 3 may be common to those described above in connection with the representative embodiments described in connection with FIGS. 1 and 2. These common aspects and details may not be repeated to avoid obscuring the description of the representative embodiments described in connection with FIG. 3.

Notably, a grid point 302 on a sphere 304 is a point at the intersection of any two lines on the sphere 204 as shown. Notably, the sphere 304 is a mathematical construct that "moves" with movement of the DUT 320.

Referring to FIG. 3, a plurality of first test probes 322, 324, 326, 328 are disposed adjacent to the DUT 320. The plurality of first test probes 322, 324, 326, 328 are each adapted to communicate and operate with the DUT 320 with two signals having orthogonal polarization states. Again, it is emphasized that the use of four first test probes (e.g., first test probes 322, 324, 326, 328) is merely illustrative and including more or fewer first test probes in the testing of the DUT 320 is contemplated.

A second test probe 330 is also disposed adjacent to the DUT 320. The second test probe 330 is adapted to communicate with the DUT with two signals having orthogonal polarization states. As described above, and more fully below, the plurality of first test probes 322~328 are adapted to measure a first communications value for each of the plurality of first test probes 322~328. Upon completion of the test, a best first communications value from the first communications values of the plurality of first test probes 322~328 is selected. Next, the one probe of the plurality of first test probes 322~328 that provides the best first communication value to operate during the test is selected. Thereafter, a second communications value is measured using the second test probe 330 with the selected one of the plurality of first test probes 322~328 operating.

In accordance with a representative embodiment, the plurality of first test probes 322~328 are disposed at an angle of arrival (AoA2.m) and the second test probe 330 is disposed at another angle of arrival (AoA1) that differs from AoA2.m. Moreover, with the current orientation of the DUT, plurality of first test probes 322~328 are disposed at locations 313, 314, 316 and 317 on the sphere 304. Similarly, the second test probe 330 is disposed at grid point 308 as shown in FIG. 3.

Testing of the DUT 320 comprises measuring a first communications value of the plurality of first test probes 322~328 at their particular grid points. The first communications value is illustratively a throughput (TP) of each of the plurality of first test probes 322~328, although other measurements related to the performance of the DUT 320 within the purview of one of ordinary skill in the art are contemplated. For example, the first communications value may be an effective isotropic sensitivity (EIS). As is known, the EIS is a measure of the sensitivity for an isotropic directivity device equivalent to the sensitivity of the discussed device exposed to an incoming wave from a defined AoA. The sensitivity is the minimum received power level at which specific requirement is met. And the isotropic directivity is substantially equal in all directions (i.e., 0 dBi).

After testing the TP of the plurality of first test probes 322~328 each at AoA2.m, the best TP of the plurality of first test probes 322~328 is selected. Notably, the orientations/angles of AoA2.m for each the plurality of first test probes 322~328 shown in FIG. 3 are different.

With the one of the plurality of first test probes 322~328 where the greatest first communications value is selected, a second communications value is measured with the second test probe 330, which is disposed at its grid point 308. Measurement of the second communications value is then carried out with the one of the plurality of first test probes 322~328 that measured the best first communications value, and the second test probe 330. By way of illustration, the second communications measurement value is illustratively the EIS, although the TP of the second test probe is contemplated as well.

After the testing of the DUT 320 is completed, the DUT 320 is moved to a new orientation and the above-described measurements are carried out again. Just by way of example, movement of the DUT 120 may be a rotation (see arrows) around the x-axis and around the z-axis of the coordinate system shown. As such, by rotating the DUT 320 completely around each axis, measurements can be made at each grid point on the sphere 304. Notably, as noted above, the sphere 304 is adapted to move with the movement of the DUT 320, so while the plurality of first test probes 322~328 and the second test probe 330 are stationary for each test, the respective locations of the sphere where each of plurality of first test probes 322~328 and the second test probe 330 are located for the selected AoA changes. Again, and as will be appreciated, rotating the DUT 320 in 3D each of the x and z axes enables testing of at each grid point on the sphere 304.

Upon completion of the testing, the distribution function (CDF) for the DUT 320 is determined for the second communications measurement and the best first communications measurement is determined. Again, it is emphasized that the measurement of the CDF is merely illustrative, and other indicia of performance of the DUT 320 are contemplated.

Figure 4:
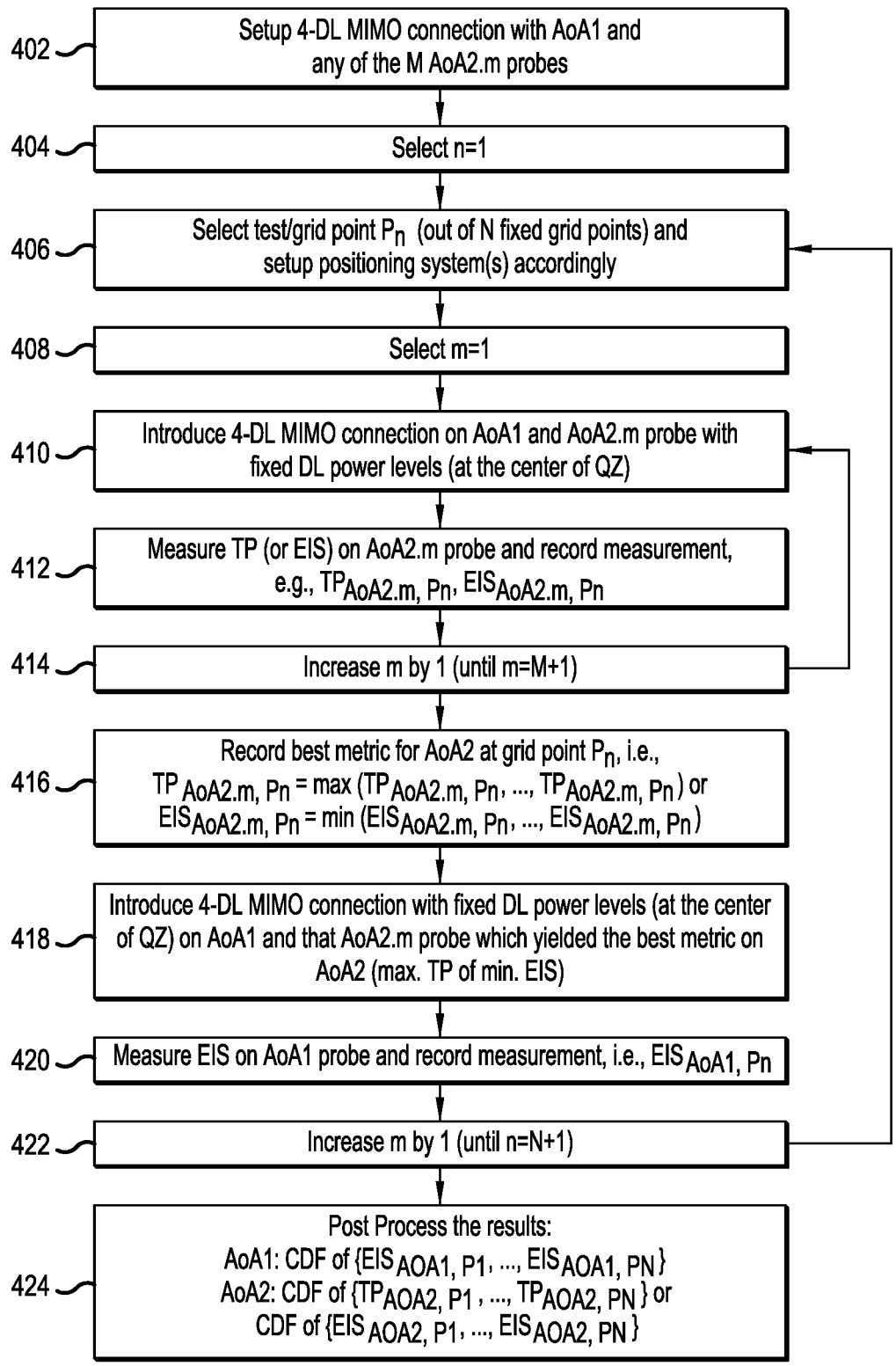
FIG. 4 is a flow chart of a method of testing DUTs in accordance with a representative embodiment.

FIG. 4 is a flow chart of a method 400 of testing DUTs in accordance with a representative embodiment. Various aspects and details of the representative embodiments described in connection with FIG. 4 may be common to those described above in connection with the representative embodiments described in connection with FIGS. 1-3. These common aspects and details may not be repeated to avoid obscuring the description of the representative embodiments described in connection with FIG. 4.

Notably, in FIG. 4, M is equal to the number of first test probes (e.g., the plurality of first test probes 322, 324, 326 and 328 in FIG. 3); m is the index of the particular first test probe and denotes than particular AoA of each particular first test probe (again, please refer to the plurality of first test probes 322, 324, 326 and 328 in FIG. 3). N is the number of grid points, and n is the index of each grid point.

At the outset, it is noted that the method 400 is adapted to be implemented as an algorithm stored as instructions in memory 116, and executed by the processor 118 as noted above.

At 402 a four DL multiple input multiple output (MIMO) connection with the second test probe at AoA1 and the M second test probes at AoA2.m.

At 404, n=1 is selected for the first test.

At 406 a test/grid point $P_n$ is selected from the N fixed grid points of the first test, with the requisite positioning of the DUT using the device 112.

At 408 m=1 is selected.

At 410 a 4 DL MIMO connections is introduced on the plurality of first test probes (at angle AoA2.m) and the second test probe at AoA1 with fixed DL power levels (at the center of the quiet zone (QZ).

At 412 measurements are made of the first communications value of the plurality of first test probes. As noted above, the first communications value may be TP (e.g., $TP_{AoA2.m, pn}$) or EIS (e.g., $EIS_{AoA2.m, pn}$).

At 414, m is increased by 1 (until m=M+1) and the method continues by repeating 410-414. Again, once m=M+1 the method 400 continues to 416.

At 416 the best first communications value is recorded for AoA2 at grid point $P_n$. Following the noted illustrative first communications value, at 414 the best first communication value may be $TP_{AoA2, pn}=MaX(TP_{AoA2.1, pn} \ldots TP_{AoA2.M, pn})$ or $EIS=min(EIS_{AoA2.1, pn} \ldots EIS_{AoA2.M, pn})$. As such, and by way of example, the best first communications value taken from a test using the plurality of first test probes 322~328 is determined for the particular grid points when the DUT 320 is disposed at a first orientation.

At 418 four DL MIMO connections are with the connection of the fixed DL power levels (at the center of the QZ) of the second test probe at AoA1 and the first test probe at AoA2 that yielded the best first communications value as discussed above.

At 420 EIS is measured using the second test probe at AoA1 and the measurement is recorded.

At 422 m is incremented by 1, and the method returns to 406.

At 424, after all tests of the DUT at the selected number of grid points are complete, the results of the various tests are recorded.

Upon completion of the test using the selected one plurality of first test probes and the second test probe that provides the best first communications value, the power output of the second test probe is adjusted to provide a desired second communications value. Just by way of illustration, an EIS of 95% may be selected as the desired second communications value.

Although testing of DUTs over a sphere of grid points has been described with reference to several exemplary embodiments, it is understood that the words that have been used are words of description and illustration, rather than words of limitation. Changes may be made within the purview of the appended claims, as presently stated and as amended, without departing from the scope and spirit of present teachings in their various aspects. Although testing of DUTs has been described with reference to particular means, materials and embodiments, these means, materials and embodiments are not intended to be limited to the particulars disclosed; the testing of DUTs according to the present teachings extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:

1. A method for testing a communications device, the method comprising:
    locating at least two first test probes adjacent to a device under test (DUT), the first test probe adapted to communicate and operate with the DUT with two signals having orthogonal polarization states;
    locating a second test probe adjacent to the DUT, the second test probe being adapted to communicate with the DUT with two signals having orthogonal polarization states;
    measuring a first communications value of each of the at least two first test probes;
    selecting a best first communications value from the first communications values the at least two first test probes;
    selecting the one of the at least two first test probes that provides the best first communication value to operate during the test; and
    measuring a second communications value with the second test probe and the selected one of the at least two second test probes.

2. The method of claim 1, wherein the at least two first test probes are disposed at fixed angular offsets from the second test probe, and the first test probe is disposed at a grid point on a sphere.

3. The method of claim 1, further comprising:
after the measuring the second communications value, moving the DUT to a different orientation relative to the at least two first test probes and the second test probe;
measuring another first communications value of each of the at least two first test probes;
selecting another best first communications value from the throughputs of the at least two first test probes; and
measuring another second communications value with the second test probe.

4. The method of claim 1, wherein the first communications value is a throughput (TP) value, and the second communications value is an effective isotropic sensitivity (EIS).

5. The method of claim 1, wherein the first communications value is a first EIS value, and the second communications value is a second EIS value.

6. The method of claim 1, further comprising, after the measuring the second communications value, adjusting a power level of the second test probe to reach until the second communications value reached a predefined level.

7. The method of claim 1, wherein the at least two first test probes are disposed at predetermined distances from the second test probe and from one another.

8. A system for testing a communications device, comprising:
at least two first test probes disposed adjacent to a device under test (DUT), the at least two first test probe adapted to communicate with the DUT with two signals having orthogonal polarization states;
a second test probe disposed adjacent to the DUT, the second test probe being adapted to communicate with the DUT with two signals having orthogonal polarization states;
a processor;
a memory that stores instructions, which when executed by the processor, cause the processor to:
measure a first communications value of each of the at least two first test probes;
select a best first communications value from the first communications values the at least two first test probes;
select the one of the at least two first test probes that provides the best first communication value to operate during the test; and
measure a second communications value with the second test probe and the selected one of the at least two second test probes.

9. The system of claim 8, wherein the at least two first test probes are disposed at fixed angular offsets from the second test probe, and the first test probe is disposed at a grid point on a sphere.

10. The system of claim 8, wherein after the measuring the second communications value, the instructions further cause the processor to:
move the DUT to a different orientation relative to the at least two first test probes and the second test probe;
measure another first communications value of each of the at least two first test probes;
select another best first communications value from the throughputs of the at least two first test probes; and
measure another second communications value with the second test probe.

11. The system of claim 8, wherein the first communications value is a throughput value, and the second communications value is an effective isotropic sensitivity (EIS) value.

12. The system of claim 8, wherein the first communications value is a first EIS value, and the second communications value is a second EIS value.

13. The system of claim 8, wherein the instructions further cause the processor to adjust a power level of the second test probe to reach a predefined level.

14. The system of claim 8, wherein the at least two first test probes are disposed at predetermined distances from the second test probe and from one another.

15. A tangible, non-transitory computer readable medium that stores instructions, which when executed by a processor, cause the processor to:
measure a first communications value of each of at least two first test probes;
select a best first communications value from the first communications values of at least two first test probes;
select the one of the at least two first test probes that provides the best first communication value to operate during the test; and
measure a second communications value with a second test probe and the selected one of the at least two second test probes.

16. The tangible, non-transitory computer readable medium of claim 15, wherein the first communications value is a throughput (TP) value, and the second communications value is an effective isotropic sensitivity (EIS) value.

17. The tangible, non-transitory computer readable medium of claim 15, wherein the first communications value is a first EIS value, and the second communications value is a second EIS value.

18. The tangible, non-transitory computer readable medium system of claim 15, wherein after the measuring the second communications value, the instructions further cause the processor to adjust a power level of the second test probe until the second communications value reached a predefined level.

* * * * *